(12) United States Patent
Sakamoto et al.

(10) Patent No.: US 10,640,883 B2
(45) Date of Patent: May 5, 2020

(54) METHOD AND APPARATUS FOR PRODUCING EPITAXIAL WAFER

(75) Inventors: Kenji Sakamoto, Tokyo (JP);
Masayuki Tsuji, Tokyo (JP)

(73) Assignee: SUMCO Corporation, Tokyo (JP)

( * ) Notice: Subject to any disclaimer, the term of this patent is extended or adjusted under 35 U.S.C. 154(b) by 1091 days.

(21) Appl. No.: 13/395,677

(22) PCT Filed: Sep. 10, 2010

(86) PCT No.: PCT/JP2010/005559
§ 371 (c)(1),
(2), (4) Date: Mar. 13, 2012

(87) PCT Pub. No.: WO2011/033752
PCT Pub. Date: Mar. 24, 2011

(65) Prior Publication Data
US 2012/0174859 A1 Jul. 12, 2012

(30) Foreign Application Priority Data

Sep. 17, 2009 (JP) .................... 2009-215461
Aug. 12, 2010 (JP) .................... 2010-181047

(51) Int. Cl.
*C30B 25/16* (2006.01)
*C30B 25/12* (2006.01)
(Continued)

(52) U.S. Cl.
CPC .............. *C30B 25/12* (2013.01); *C30B 25/02* (2013.01); *C30B 25/16* (2013.01); *C30B 29/06* (2013.01);
(Continued)

(58) Field of Classification Search
CPC ......... C30B 25/02; C30B 25/12; C30B 25/16; C30B 29/06; H01L 21/02532; H01L 21/0262
See application file for complete search history.

(56) References Cited

U.S. PATENT DOCUMENTS 5,993,555 A * 11/1999 Hamilton ............... 118/715
6,042,654 A * 3/2000 Comita et al. ............ 134/2
(Continued)

FOREIGN PATENT DOCUMENTS

DE 198 01 439 A1 10/1998
JP 2000336482 A 12/2000
(Continued)

OTHER PUBLICATIONS

Office Action in Japanese Application No. 2011-531784, dated Oct. 29, 2013 (2 pages).
(Continued)

*Primary Examiner* — Hua Qi
(74) *Attorney, Agent, or Firm* — Pepper Hamilton LLP (57) ABSTRACT

After removing deposit on a susceptor in an epitaxial growth furnace by a cleaning recipe (step S101), a first epitaxial wafer is produced by growing an epitaxial layer on a first wafer based on a process recipe A (step S102). Subsequently, a step of producing an epitaxial wafer by growing an epitaxial layer on a wafer based on a process recipe B including second control parameters set such that the epitaxial wafer has approximately the same film thickness profile as the first wafer (step S103) is repeated a plurality of times to successively produce a plurality of epitaxial wafers (step S104). The cleaning recipe, the process recipe A, and the process recipe B repeated a plurality of times are carried out repeatedly (step S105).

11 Claims, 8 Drawing Sheets

(51) Int. Cl.
*C30B 25/02* (2006.01)
*C30B 29/06* (2006.01)
*H01L 21/02* (2006.01)

(52) U.S. Cl.
CPC .... *H01L 21/0262* (2013.01); *H01L 21/02532* (2013.01)

(56) References Cited

U.S. PATENT DOCUMENTS

| | | | | |
|---|---|---|---|---|
| 6,977,359 | B2* | 12/2005 | Kasai | 219/490 |
| 7,235,492 | B2* | 6/2007 | Samoilov | 438/714 |
| 7,289,865 | B2* | 10/2007 | Bauer | 700/121 |
| 7,340,320 | B2* | 3/2008 | Takizawa | H01L 22/20 257/E21.525 |
| 7,479,187 | B2* | 1/2009 | Otsuka | 117/89 |
| 7,615,116 | B2* | 11/2009 | Kanaya et al. | 117/84 |
| 8,093,154 | B2* | 1/2012 | Zojaji et al. | 438/706 |
| 2001/0001384 | A1* | 5/2001 | Arai | C23C 16/4585 117/84 |
| 2006/0169669 | A1* | 8/2006 | Zojaji | B08B 7/0035 216/58 |
| 2010/0029066 | A1* | 2/2010 | Miyashita | C23C 16/4584 438/478 |
| 2011/0017127 | A1* | 1/2011 | von Kanel et al. | 117/97 |

FOREIGN PATENT DOCUMENTS

| | | |
|---|---|---|
| JP | 2002343726 A | 11/2002 |
| JP | 2002359250 A | 12/2002 |
| JP | 2002367975 A | 12/2002 |
| JP | 2003203867 A | 7/2003 |
| JP | 2003526731 A | 9/2003 |
| JP | 2004289098 A | 10/2004 |
| JP | 2006295179 A | 10/2006 |
| JP | 2007146252 A | 6/2007 |
| JP | 2008277795 A | 11/2008 |

OTHER PUBLICATIONS

Office Action in German Application No. 11 2010 003 694.2, dated Feb. 3, 2015 (2 pages).

* cited by examiner

METHOD AND APPARATUS FOR PRODUCING EPITAXIAL WAFER

CROSS-REFERENCE TO RELATED APPLICATIONS

The present application claims the priority of JP patent application No. 2009-215461 filed Sep. 17, 2009 and JP patent application No. 2010-181047 filed Aug. 12, 2010, the entire disclosure of which is incorporated by reference.

TECHNICAL FIELD

The present invention relates to a method and an apparatus for successively producing epitaxial wafers in which an epitaxial growth layer is formed on a surface of a semiconductor wafer using a single wafer processing epitaxial growth furnace.

RELATED ART

In recent years, as silicon wafers for MOS devices, epitaxial wafers are used in which a dopant is added to a surface of a low resistivity silicon wafer heavily doped with a dopant, the concentration of the dopant added to the surface being lower than that of the dopant in the wafer. These epitaxial wafers provide improved yield for gate oxide films of MOS devices, and besides they have excellent characteristics such as reduced parasitic capacitance, prevention of soft errors, improved gettering performance, and the like.

With respect to the production of the above-mentioned epitaxial wafers, it has become difficult to achieve larger diameter silicon wafers by a conventionally performed batch production process in which a plurality of silicon wafers are simultaneously subjected to an epitaxial growth process. Therefore, single wafer processing epitaxial growth apparatuses have come to be mainly used. In recent years, epitaxial growth apparatuses for large diameter wafers, which are capable of performing epitaxial growth on wafers having a diameter of 300 mm or more have been developed.

With a single wafer processing epitaxial growth apparatus, a wafer mounted on a susceptor in an epitaxial growth furnace is heated to a high temperature and rotated at the same time, and a silicon reactive gas using hydrogen carriers is introduced to generate a silicon thin film on the surface of the wafer. As the silicon reactive gas used in silicon epitaxial growth, monosilane gas ($SiH_4$), silane chloride gas ($SiH_2Cl_2$, $SiHCl_3$), or the like is used.

On the other hand, in this reaction process, product of material gas, such as amorphous silicon or a silane chloride polymer is attached and deposited on a wall surface, a susceptor, and the like in an epitaxial growth furnace. The deposit that has come off in an epitaxial growth process would adhere onto a wafer to be an impurity mixed into a thin film of the wafer. This would lead to degradation in the quality of the wafers. Therefore, in order to remove the deposit between sequential wafer epitaxial growth processes, a cleaning process is performed through predetermined steps by supplying a cleaning gas such as hydrochloric gas or chlorine trifluoride gas into the epitaxial growth furnace (for example, see Patent Document 1 and Patent Document 2).

DISCLOSURE OF THE INVENTION

Patent Document 1: JP 2004-289098 (A)
Patent Document 2: JP 2008-277795 (A)

Problems to be Solved by the Invention

As in the inventions disclosed in Patent Documents 1 and 2, after an epitaxial growth process is performed, the inside of an epitaxial furnace is cleaned to remove Si deposit deposited in the epitaxial furnace. For example, the quality of an epitaxial wafer can be prevented from being degraded by the deposit that has been deposited on a ceiling part of the epitaxial growth apparatus and falls off to adhere to the wafer surface. Therefore, in view of preventing quality degradation caused by deposit, performing a cleaning process after every epitaxial growth process is the most desirable form of operation; however, this leads to low operating efficiency and low productivity, which is a problem.

When the deposit amount increasing with increase in the number of epitaxial growth processes exceeds a certain limit, the deposit deposited in the epitaxial furnace falls off to adhere to the wafer surface, which results in quality degradation. Therefore, it is also advantageous in an aspect of cost to previously find the permissible number of epitaxial growth processes experimentally, which does not cause fall-off of deposit, and then clean the inside of the furnace after performing this predetermined number or less of epitaxial growth processes.

However, the present inventors conducted experiments to find that when a process recipe set for producing a desired epitaxial wafer is successively performed a plurality of times after carrying out a recipe for cleaning, the first epitaxial wafer produced by a first process recipe after the cleaning recipe is different from the second epitaxial wafer and other epitaxial wafers produced subsequently, in film thickness profile of the epitaxial layer at the wafer periphery.

An object of the present invention is to provide a method for producing epitaxial wafers, which can successively perform a production of an epitaxial wafer a plurality of times to obtain epitaxial wafers with uniform quality after an epitaxial growth process and between one cleaning process and the next cleaning process. Another object is to provide an apparatus for producing epitaxial wafers (epitaxial wafer production apparatus) using the production method.

Means for Solving the Problem

A method for producing epitaxial wafers according to the present invention for achieving the above object is a method for producing epitaxial wafers using a single wafer processing epitaxial growth furnace, which is characterized by including the steps of cleaning for removing deposit on a susceptor in the epitaxial growth furnace; first wafer processing for obtaining a first epitaxial wafer by mounting a first wafer on the susceptor and growing an epitaxial layer on the first wafer based on first control parameters; and second wafer processing after transferring the first epitaxial wafer on the susceptor, for obtaining a second epitaxial wafer by mounting a second wafer on the susceptor and growing an epitaxial layer on the second wafer based on second control parameters set such that the second epitaxial wafer has approximately the same film thickness profile as the first epitaxial wafer.

Further, it is preferable that a process sequence of performing the step of cleaning, subsequently performing the step of the first wafer processing once, and successively performing the step of the second wafer processing twice or more after the first wafer processing, is carried out repeatedly.

Preferably, the first control parameters and the second control parameters are different from each other in at least one of process conditions of a flow rate of reactive gas for growing the epitaxial layer, processing time, and a flow rate of dopant gas.

More preferably, the epitaxial growth furnace includes a layer formation chamber which is substantially partitioned into an upper space and a lower space by the susceptor, and the first control parameters and the second control parameters each include a flow rate of the reactive gas supplied to the upper space of the layer formation chamber and a flow rate of inert gas supplied to the lower space of the layer formation chamber.

Further, the flow rate of the reactive gas, which is included in the second control parameters, is preferably lower than the flow rate of the reactive gas, which is included in the first control parameters. The flow rate of the inert gas, which is included in the second control parameters, is preferably lower than the flow rate of the inert gas, which is included in the first control parameters.

Preferably, at least a surface portion of the susceptor is made of silicon carbide (SiC) through the cleaning step.

Further, it is preferable that the reactive gas is trichlorosilane ($SiHCl_3$), and the inert gas is hydrogen gas ($H_2$ gas).

An apparatus for producing epitaxial wafers according to the present invention, for achieving the above object is an apparatus for producing epitaxial wafers, which has a single wafer processing epitaxial growth furnace, is characterized by including a storage means for storing: a cleaning recipe for removing deposit on a susceptor in the epitaxial growth furnace, a first process recipe for obtaining a first epitaxial wafer by growing an epitaxial layer on a first wafer mounted on the susceptor based on first control parameters, and a second process recipe for obtaining a second epitaxial wafer having a film thickness profile approximately the same as the first epitaxial wafer by growing an epitaxial layer on the second wafer mounted on the susceptor based on second control parameters different from the first control parameters; and a control means for reading out the recipes stored in the storage means to control the epitaxial growth apparatus in accordance with the read out recipes.

Further, it is preferable that the control means repeatedly carries out a process sequence of performing the cleaning recipe, subsequently performing the first process recipe once, and successively performing the second process recipe a plurality of times after the first process recipe is carried out.

Preferably, the first control parameters and the second control parameters are different from each other in at least one of process conditions of a flow rate of reactive gas for growing the epitaxial layer, processing time, and a flow rate of dopant gas.

More preferably, the epitaxial growth furnace includes a layer formation chamber which is substantially partitioned into an upper space and a lower space by the susceptor inside, and the first control parameters and the second control parameters each include a flow rate of the reactive gas supplied to the upper space of the layer formation chamber for growing the epitaxial layer and a flow rate of inert gas supplied to the lower space of the layer formation chamber.

Further, the flow rate of the reactive gas, which is included in the second control parameters, is preferably lower than the flow rate of the reactive gas, which is included in the first control parameters. The flow rate of the inert gas, which is included in the second control parameters, is preferably lower than the flow rate of the inert gas, which is included in the first control parameters.

Moreover, it is preferable that at least a surface portion of the susceptor is made of silicon carbide (SiC) and a superficial layer of the silicon carbide is exposed through the cleaning step.

Effect of the Invention

The present invention includes a step of first wafer processing for obtaining a first epitaxial wafer by growing an epitaxial layer on a first wafer after a cleaning process based on first control parameters, and a step of second wafer processing for obtaining a second epitaxial wafer having approximately the same film thickness profile as the first epitaxial wafer on a second wafer based on second control parameters different from the first control parameters. Therefore, epitaxial wafers that are more uniform in quality can be successively produced a plurality of times between one cleaning process and the next cleaning process.

BEST MODE FOR CARRYING OUT THE INVENTION

Embodiments of the present invention will be described below with reference to the drawings.

Embodiment 1

Figure 1:
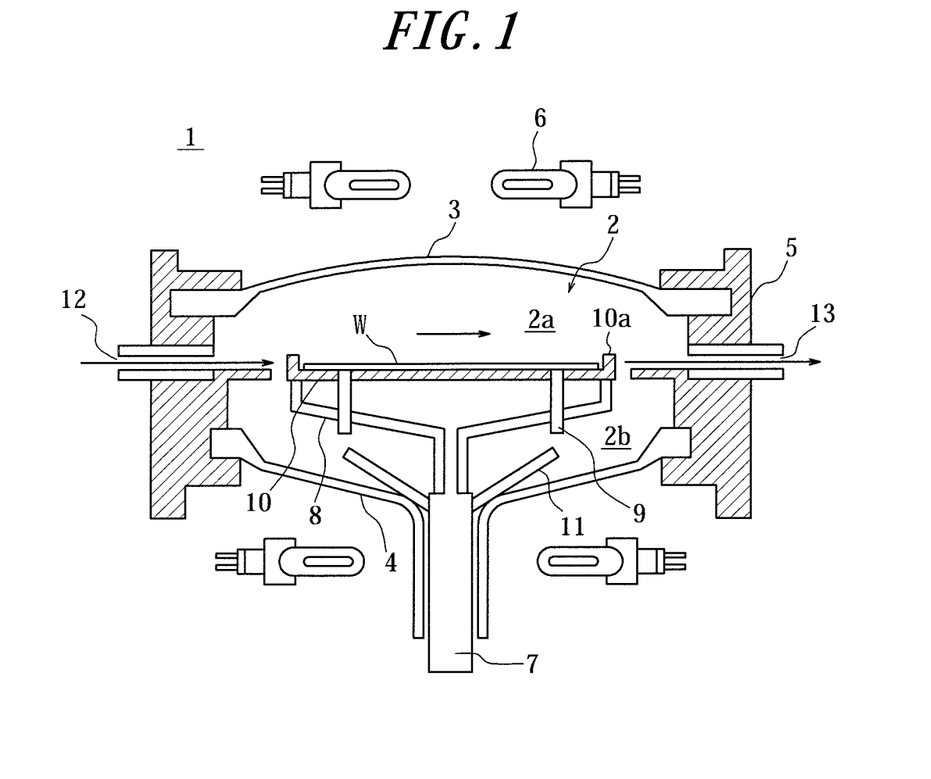
FIG. 1 is a cross-sectional view schematically showing an epitaxial growth furnace which is a main component of an epitaxial wafer production apparatus according to Embodiment 1 of the present invention.

FIG. 1 is a cross-sectional view schematically showing an epitaxial growth furnace which is a main component of an epitaxial wafer production apparatus according to Embodiment 1 of the present invention.

An epitaxial growth furnace 1 has a formation chamber for epitaxial layers (hereinafter referred to as a "layer formation chamber") 2 inside. This layer formation chamber 2 includes an upper dome 3, a lower dome 4, and a dome fitting 5 for fixing and supporting these domes 3 and 4. The upper dome 3 and the lower dome 4 are made of a transparent material such as quartz, and a susceptor 10 and a silicon wafer W mounted on the susceptor 10 to be described later are heated with a plurality of halogen lamps 6 arranged above and below the epitaxial growth furnace 1.

The epitaxial growth furnace 1 further includes the susceptor 10 which partitions the layer formation chamber 2 into an upper space 2a and a lower space 2b. The susceptor 10 has a disc shape and is rotated by rotation of a susceptor rotating shaft 7 with a lower surface of the outer part of the susceptor 10 being fixed and engaged with a support arm 8 linking the susceptor rotating shaft 7. Further, three through holes in total are formed every 120 degrees around the susceptor 10. Elevating pins 9 for raising and lowering the silicon wafer W are each loosely inserted into one of the through holes. The elevating pins 9 are raised and lowered by lift arms 11.

With respect to the material of the susceptor 10, as long as the surface of the susceptor is formed of SiC to prevent impurity contamination at the time of forming an epitaxial layer, the coated material for the susceptor is not limited in particular. A carbon base material of which surface is coated with silicon carbide (SiC) coating is generally used; alternatively, the whole susceptor 10 may be formed of SiC.

A gas supply port 12 and a gas exhaust port 13 are placed opposite to each other at positions in the dome fitting 5, the positions being at approximately the same height as the upper surface of the susceptor 10. When a film is formed, a mixed gas in which silicon reactive gas such as trichlorosilane ($SiHCl_3$) diluted with a carrier gas of hydrogen gas ($H_2$ gas) or the like is mixed with a slight amount of a dopant such as diborane ($B_2H_6$) is supplied from the gas supply port 12 into the layer formation chamber 2 in parallel with the upper surface of the silicon wafer W (horizontally). This supplied mixed gas passes over the surface of the silicon wafer W to grow an epitaxial layer and is then exhausted through the gas exhaust port 13 to the outside of the layer formation chamber 2.

On the other hand, at the time of cleaning, with the silicon wafer W being transferred from the layer formation chamber 2 by a wafer transfer mechanism to be described later, cleaning gas such as hydrogen chloride (HCl) gas is introduced into the layer formation chamber 2 from the gas supply port 12 in accordance with a specified procedure, and is exhausted through the gas exhaust port 13, thereby removing deposit from the susceptor by dry etching.

Figure 2:
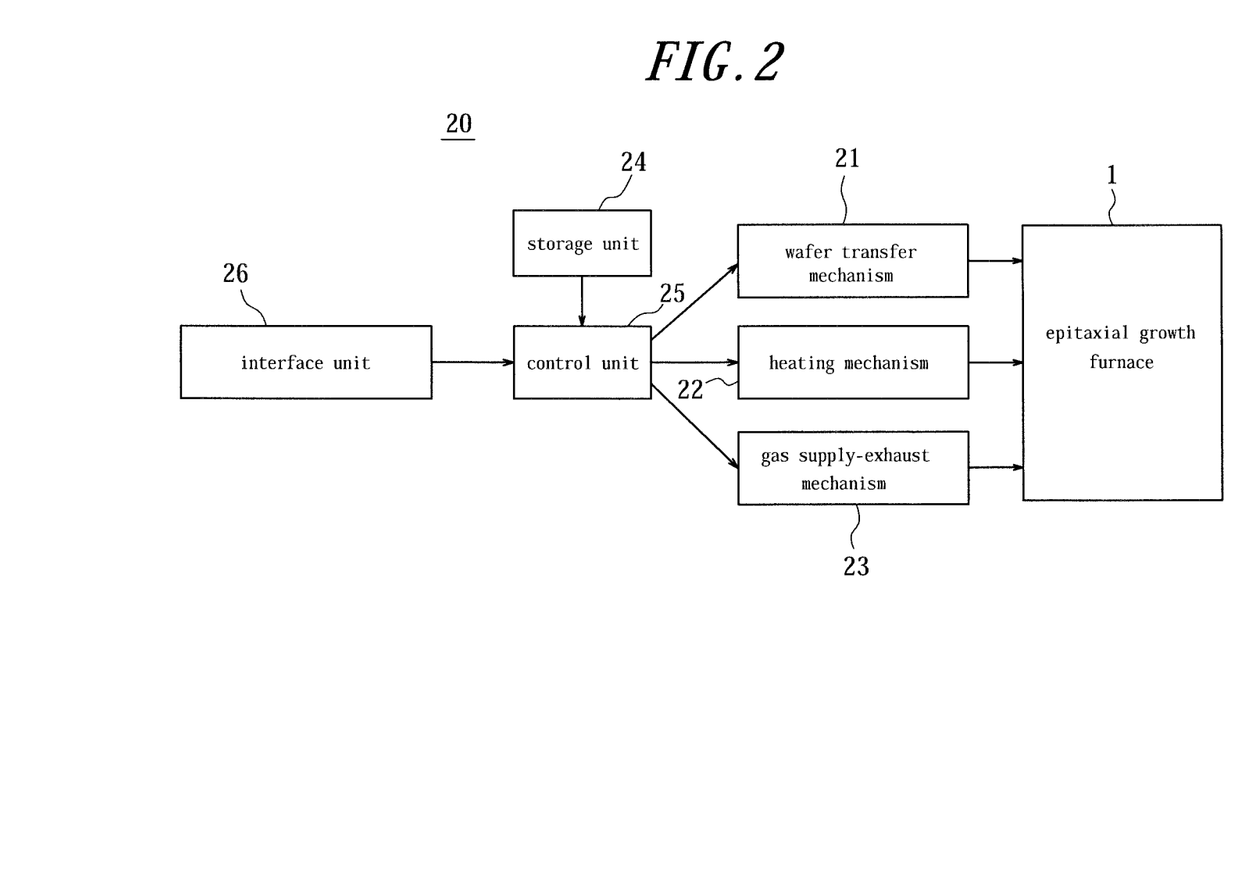
FIG. 2 is a block diagram illustrating a control system of the epitaxial wafer production apparatus, which controls the epitaxial growth furnace in FIG. 1.

FIG. 2 is a block diagram illustrating a control system of an epitaxial wafer production apparatus 20 for controlling the epitaxial growth furnace in FIG. 1. The epitaxial wafer production apparatus 20 has a wafer transfer mechanism 21, a heating mechanism 22 configured to include halogen lamps 6, and a gas supply-exhaust mechanism 23. The wafer transfer mechanism 21 carries a wafer from the outside onto the susceptor 10 in the layer formation chamber 2 of the epitaxial growth furnace 1, and exports a processed wafer on the susceptor 10 to the outside of the layer formation chamber 2. Further, the gas supply-exhaust mechanism 23 is separately connected to the gas supply port 12 and the gas exhaust port 13 to supply and exhaust a gas into and out of the layer formation chamber 2 while controlling parameters such as pressure of the gas, kind of the gas, flow rate of the gas, and the amount of a dopant in the layer formation chamber 2.

Further, the epitaxial wafer production apparatus 20 includes a storage unit 24 which is a storage means and a control unit 25 which is a control means. The storage unit 24 stores a cleaning recipe and a process recipe including process recipes A and B which are to be described later. Meanwhile, the control unit 25 controls the general process of the epitaxial wafer production apparatus 20 including the epitaxial growth furnace 1, and carries out a process in accordance with a cleaning recipe or a process recipe A or B read out from the storage unit 24 as appropriate by operation of an operator via a program or an interface unit 26. Further, the control unit 25 is configured to be able to process each wafer with a different process recipe. The storage unit 24 and the control unit 25 may be realized by hardware separate from the epitaxial growth furnace. For example, the storage unit 24 may be provided in a database system.

Note that in the present invention, a processing program for an apparatus, which is related to a process sequence and control parameters (control target values such as temperature, pressure, kind of gas and gas flow rate, and time) for generating an epitaxial wafer is referred to as a process recipe. Further, a processing program related to a process sequence and control parameters for cleaning the epitaxial growth furnace and an exhaust duct is referred to as a cleaning recipe.

In general, one product of an epitaxial wafer is produced by one kind of process recipe. However, according to the studies of the present applicant, successively produced epitaxial wafers vary in quality, and the cause is the difference between the film thickness profile of an outer part of an epitaxial wafer produced by a first process recipe after a cleaning recipe and that of a second wafer and wafers produced subsequently by the same process recipe.

In view of this, in this embodiment, in addition to the first process recipe (process recipe A) for a first wafer after a cleaning recipe which is a first epitaxial wafer, a second process recipe (process recipe B) corresponding to the production of a second wafer which is a second epitaxial wafer and wafers produced subsequently is also prepared. The second and subsequent wafers can have epitaxial films having the same film thickness profile through the same process recipe. Therefore, the single process recipe B is used. Here, while the process recipe A includes first control parameters, the process recipe B includes second control parameters.

Epitaxial growth by the process recipe B can be achieved by setting the flow rate of reactive gas, for example $SiHCl_3$ gas, growth time of the epitaxial growth, and the flow rate of dopant gas in the process recipe B such that the film thickness profile at the wafer periphery is approximately the same as the film thickness profile at the wafer periphery of the first epitaxial wafer produced by processing a first wafer by the process recipe A. On that occasion, conditions other than the above parameters are the same as the conditions of the process recipe A. Note that a case where the film thickness profiles at the wafer periphery are approximately the same means a case where comparing the difference in the film thickness at the periphery between the first wafer, and the second and subsequent wafers, the film thickness difference is smaller than the film thickness difference between a plurality of wafers epitaxially grown by one and the same process recipe A. For example, when a wafer having a diameter of 300 mm is used, the case corresponds to a case where the film thickness difference at the periphery is 5 nm or less. Note that the film thickness difference at the periphery is defined as ROA2 difference to be described later.

According to an experiment by the present inventors using $SiHCl_3$ gas as a reactive gas, the parameters of the above process recipe B are found to be generally given by the following expressions:

$$SiHCl_3 \text{ flow rate} = SiHCl_3 \text{ flow rate for first wafer} - a \quad (1)$$

$$\text{Epitaxial growth time} = \text{Median of epitaxial film thicknesses/Epitaxial growth rate of second wafer} \quad (2)$$

$$\text{Dopant gas flow rate} = \text{Dopant gas flow rate for first wafer} - [b \times (\text{Epitaxial growth rate of first wafer} - \text{Epitaxial growth rate for second wafer}) + c] \quad (3)$$

where a, b, and c are constants that vary depending on the attributions of the epitaxial growth apparatus, the wafer, and the like. Further, both the epitaxial growth rate of the first wafer and the epitaxial growth rate of the second wafer can be determined by the epitaxial film thickness divided by the epitaxial growth time. The median of the epitaxial film thicknesses means a median in the range of epitaxial film thickness required in a specification for an epitaxial wafer product, which is the targeted epitaxial film thickness. The epitaxial film thickness was measured using a Fourier transform infrared spectrometer (QS3300 manufactured by Nanometrics Incorporated); however, the method of measuring the epitaxial film thickness is not limited thereto.

Next, a method for producing epitaxial wafers according to Embodiment 1 of the present invention will be described with reference to the flow chart in FIG. 3.

As the production of an epitaxial wafer is started, the control unit 25 initiates a process in accordance with the processing details received from the storage unit 24. First, under control by the control unit 25 a cleaning step for the susceptor 10 in the layer formation chamber 2 is performed based on a cleaning recipe (step S101). Note that when the inside of the layer formation chamber 2 is already cleaned, this step need not be performed.

Next, the control unit 25 carries out a process recipe A as a step of first wafer processing (step S102). In the process recipe A, a polished wafer is transferred into the layer formation chamber 2 to be mounted on the susceptor 10 by the wafer transfer mechanism 21. Then, epitaxial growth is performed with a process sequence and control parameters specified by the process recipe A to produce a first epitaxial wafer in accordance with the required specification, and the first epitaxial wafer is exported from the layer formation chamber 2 by the wafer transfer mechanism 21.

Next, the control unit 25 carries out a process recipe B as a step of second wafer processing (step S103). As with the case of the step S102, a polished wafer is mounted on the susceptor 10. In the process recipe B, as described above, the flow rate of reactive gas (for example, $SiHCl_3$ gas), growth time of the epitaxial growth, and the flow rate of dopant gas are set so as to achieve a film thickness profile at the periphery, which is equivalent to that of the first epitaxial wafer produced by the process recipe A. Thus, an epitaxial wafer having approximately the same film thickness profile as the first wafer is produced and exported.

After that, an epitaxial growth apparatus 1 repeats the process recipe B four times under control by the control unit 25 (step S104) to produce total five epitaxial wafers having approximately the same film thickness profiles. Thereafter, the epitaxial growth apparatus 1 repeatedly carries out the cleaning process and the production of five epitaxial wafers through the process recipes A and B (steps S101-S104) until it receives a termination instruction by a program or an operator (step S105). Note that the repetition number of the wafer production through the process recipe B is not limited to four times, and may be set arbitrarily as long as it dose not degrade the wafer quality.

As described above, according to Embodiment 1, deposit on a susceptor in an epitaxial growth furnace is removed using a cleaning recipe, and a first wafer is then produced by a process recipe A. Further, wafers are processed by the process recipe B in which the flow rate of reactive gas ($SiHCl_3$ gas) supplied to the upper space 2a of the layer formation chamber 2 is set so as to produce a second and subsequent wafers having approximately the same film thickness profiles at the wafer periphery as the first wafer. Thus, epitaxial wafers with less variation in quality can be produced successively. Therefore, productivity of epitaxial wafers can be improved. Actually, in a case where five epitaxial wafers are produced successively as described above, the productivity can be improved by about 25%.

Embodiment 2

The present inventors found that when epitaxial growth processes are performed under the same conditions (gas flow rate, growth time, flow rate of dopant gas, and the like), irrespective of the flow rate of the reactive gas ($SiHCl_3$) used for the first wafer epitaxial growth process, the difference in the film thickness at the periphery between the first wafer and the second and subsequent wafers becomes substantially constant. Therefore, the process conditions of the epitaxial growth processes for the second and subsequent wafers, which are required for eliminating the film thickness difference, can be achieved by adjusting the flow rates of the reactive gas ($SiHCl_3$) to be charged into the upper space 2a of the layer formation chamber 2 and the inert gas ($H_2$ gas) charged into the lower space 2b of the layer formation chamber 2.

Specifically, as compared with the process conditions for the first wafer, the flow rates of the reactive gas and the inert gas are each reduced by a predetermined amount correspondingly in the conditions. Further, the epitaxial growth time on that occasion is determined so as to achieve targeted film thickness in accordance with the flow rate of the reactive gas, and the flow rate of the dopant gas is determined so as to achieve targeted electric resistivity. Reduction in the flow rate of the inert gas ($H_2$ gas) charged into the lower space 2b of the layer formation chamber 2 increases the film thickness of the epitaxial layer. This is assumed to be because the pressure balance between the upper space 2a and the lower space 2b in the layer formation chamber 2 is changed to change the flow of the reactive gas at the wafer periphery, which results in the effect of increasing the film thickness. This method will be described with reference to the drawings.

Figure 4:
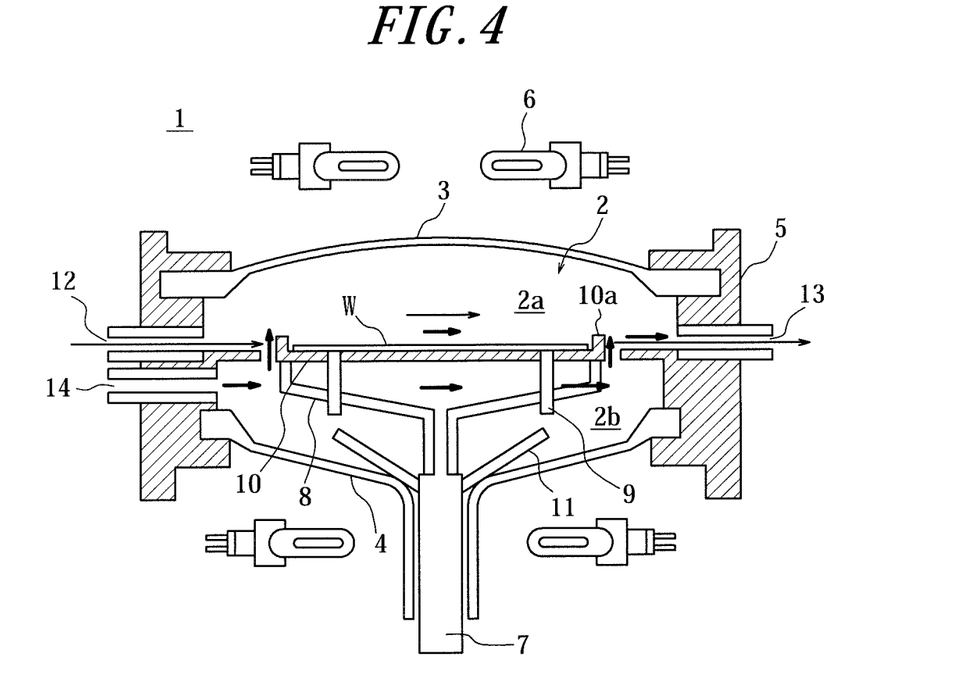
FIG. 4 is a cross-sectional view schematically showing an epitaxial growth furnace which is a main component of an epitaxial wafer production apparatus according to Embodiment 2 of the present invention.

FIG. 4 is a cross-sectional view schematically showing an epitaxial growth furnace which is a main component of an epitaxial wafer production apparatus according to Embodiment 2 of the present invention. This embodiment is characterized in that in the epitaxial wafer production method described in Embodiment 1, the flow rate of the inert gas ($H_2$ gas) charged into the lower space 2b of the layer formation chamber 2 is also adjusted.

Therefore, under the gas supply port 12 in the dome fitting 5 of the epitaxial wafer production apparatus 20, another gas supply port 14 for supplying inert gas such as hydrogen gas ($H_2$ gas) to the lower space 2b of the layer formation chamber 2 is provided. The gas supply port 14 is connected to the gas supply-exhaust mechanism 23 to control the supply of gas. Further, the outer part of the susceptor 10 and the inner periphery of the dome fitting 5 of the layer formation chamber 2 are spaced apart by a small gap having a circular shape along the outer part of the susceptor 10. This inevitably causes a difference in pressure balance between the upper space 2a provided between the upper dome 3 and the susceptor 10, and the lower space 2b provided between the lower dome 4 and the susceptor 10. The structure other than this is the same as the epitaxial wafer production apparatus 20 of Embodiment 1.

With the structure above, at the time of forming a film, inert gas with a gas pressure slightly higher than the mixed gas of the upper space 2a of the layer formation chamber 2 is supplied to the lower space 2b of the layer formation chamber 2. This inert gas is made to flow into the upper space 2a of the layer formation chamber 2 by the ascending current generated through the gap between the dome fitting 5 and the edge of the susceptor 10, and exhausted from the gas exhaust port 13 with the mixed gas supplied from the gas supply port 12. This prevents the mixed gas from flowing into the lower space 2b of the layer formation chamber 2.

Next, a method for producing epitaxial wafers according to Embodiment 2 of the present invention will be described. Epitaxial wafers in Embodiment 2 are also produced based on the flow chart in FIG. 3

In Embodiment 2, in the process recipe B (step S103), the flow rate(s) of reactive gas ($SiHCl_3$ gas) into the upper space 2a of the layer formation chamber 2 and/or inert gas ($H_2$ gas) into the lower space 2b of the layer formation chamber 2 is reduced by a predetermined amount corresponding to the flow rates in the process recipe A such that the film thickness at the wafer periphery closely matches the film thickness at the wafer periphery of the first wafer in the process recipe A. Further, the epitaxial growth time and the flow rate of the dopant gas in this case are also determined depending on the flow rates of the reactive gas and inert gas. The other steps are the same as those in Embodiment 1 so the explanation will be omitted.

As described above, according to Embodiment 2 of the present invention, in addition to setting the flow rate of the reactive gas ($SiHCl_3$ gas) supplied to the upper space 2a of the layer formation chamber 2, the flow rate of the inert gas ($H_2$ gas) supplied to the lower space 2b of the layer formation chamber 2 is set such that the second and subsequent wafers have approximately the same film thickness profile at the wafer periphery as the first wafer. Thus, epitaxial wafers with further less variation in quality can be produced successively.

EXAMPLE

Next, examples of the present invention will be described using comparative examples.

Example 1

Figure 3:
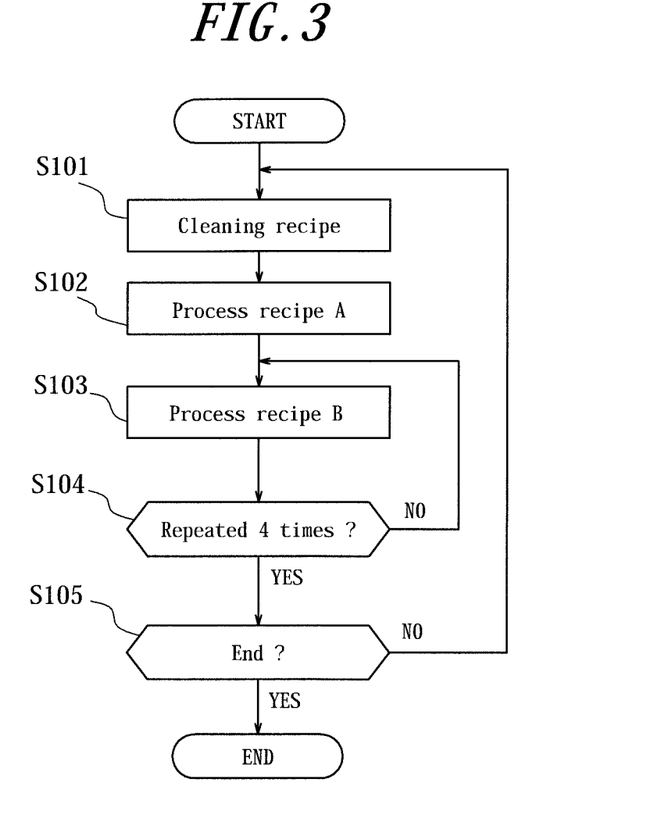
FIG. 3 is a process flow chart of a method for producing epitaxial wafers according to an embodiment of the present invention.
Figure 5:
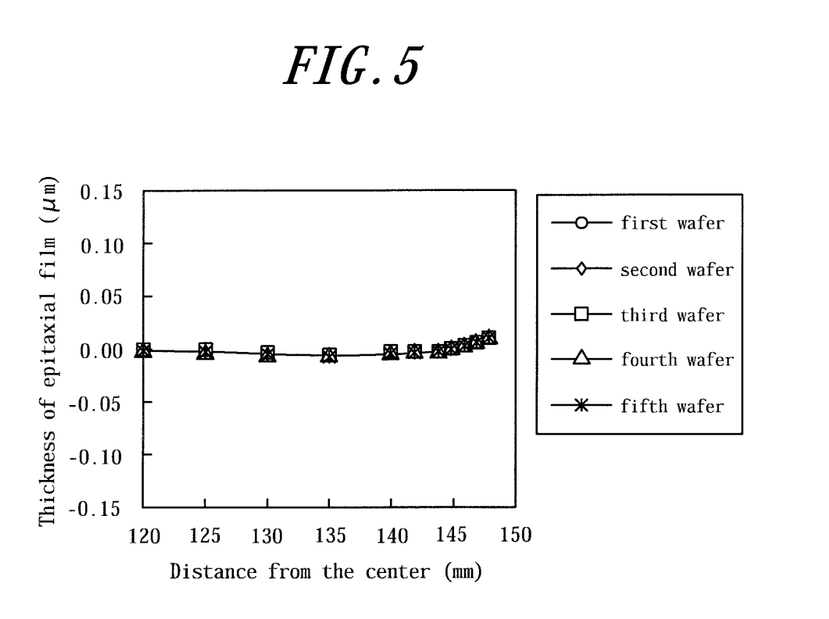
FIG. 5 is a graph showing the film thickness profiles of epitaxial layers in a case where five wafers are processed by the process flow in FIG. 3 (Example 1).

FIG. 5 corresponds to Embodiment 1 and is a graph showing the film thickness profiles of epitaxial layers obtained by processing five wafers in accordance with the process flow chart shown in FIG. 3 using the epitaxial wafer production apparatus shown in FIG. 1. The horizontal axis in this graph represents the distance from the wafer center toward the radial direction, and the vertical axis represents the difference between the film thickness of the epitaxial film of a produced wafer and the desired film thickness normalized to zero. As shown in this graph, the film thickness profiles at the wafer periphery of the first wafer after cleaning to the fifth wafer coincide closely. Note that the film thickness of each epitaxial film was measured using a Fourier transform infrared spectrometer (QS3300 manufactured by Nanometrics Incorporated).

Comparative Example 1

Figure 6:
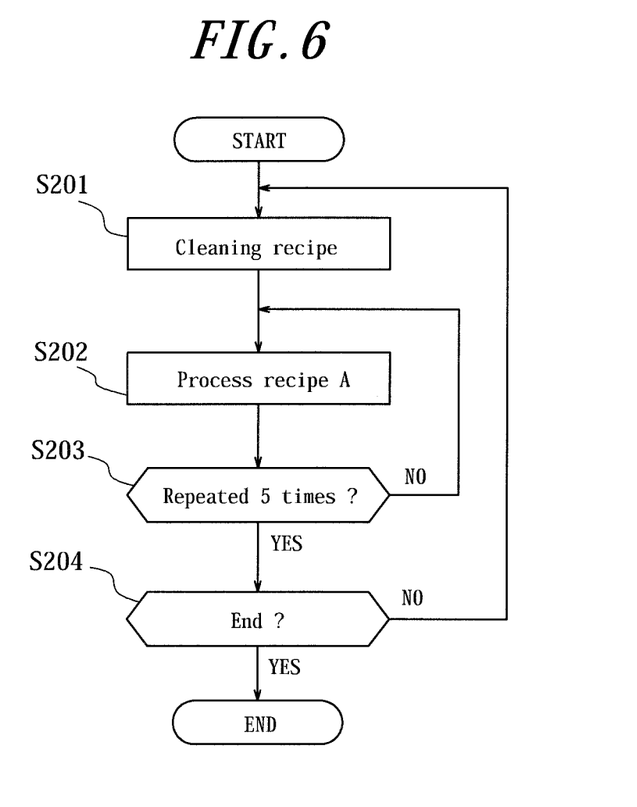
FIG. 6 is a process flow chart of a method for producing epitaxial wafers, in which a silicon epitaxial film is formed on each of five silicon wafers by the same process recipe.

FIG. 6 is a flow chart of a method for producing epitaxial wafers in a case where five wafers are processed by the same process recipe for comparison. As shown in this FIG. 6, in Comparative Example 1, after the susceptor 10 is cleaned by a cleaning recipe (step S201), five wafers are successively processed by the process recipe A (step S202) (step S203). Thereafter, the steps S201-S203 are carried out repeatedly (step S204) until a termination instruction by a program or an operator is received.

Figure 7:
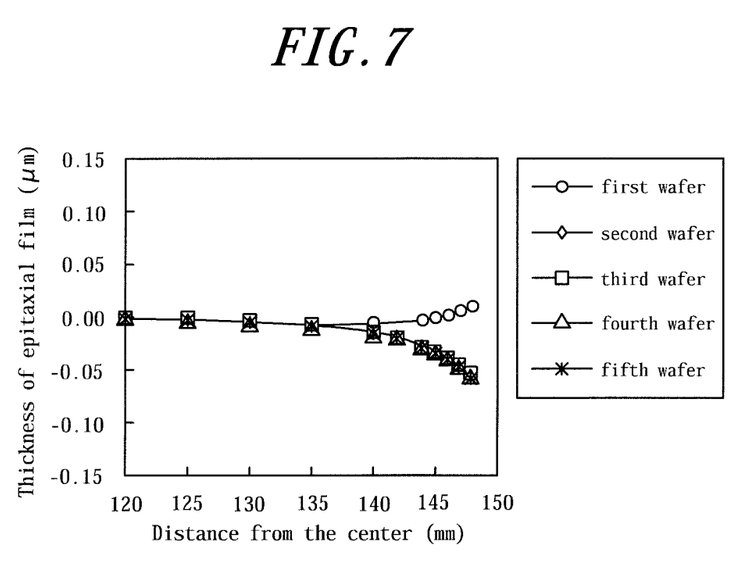
FIG. 7 is a graph showing the film thickness profiles of epitaxial layers in a case where five wafers are processed by the process flow in FIG. 6 (Comparative Example 1).

FIG. 7 is a graph showing the film thickness profile of each epitaxial layer obtained by successively processing a plurality of recipes by the process flow shown in FIG. 6 using the epitaxial wafer production apparatus shown in FIG. 1. The measurement method and representations of the vertical axis, horizontal axis, and the like of the graph are the same as FIG. 5. As compared with the example of the present invention shown in FIG. 5, the film thickness profile at the wafer periphery of the first wafer after cleaning greatly differs from that of the second to fifth wafers. Therefore, epitaxial wafers according to Comparative Example 1 greatly vary in quality, and such a method cannot be used in practice.

The difference in the film thickness profile at the wafer periphery between the first wafer and the second and subsequent wafers is caused because of the temperature difference at the wafer periphery, which is generated as follows. Silicon on the outer part 10a of the susceptor 10 placed further outside the wafer periphery with the wafer mounted thereon is removed immediately after the cleaning recipe; on the other hand, after the first epitaxial growth process, the outer part 10a is coated with silicon by the supplied $SiHCl_3$ gas.

Comparative Example 2

Figure 8:
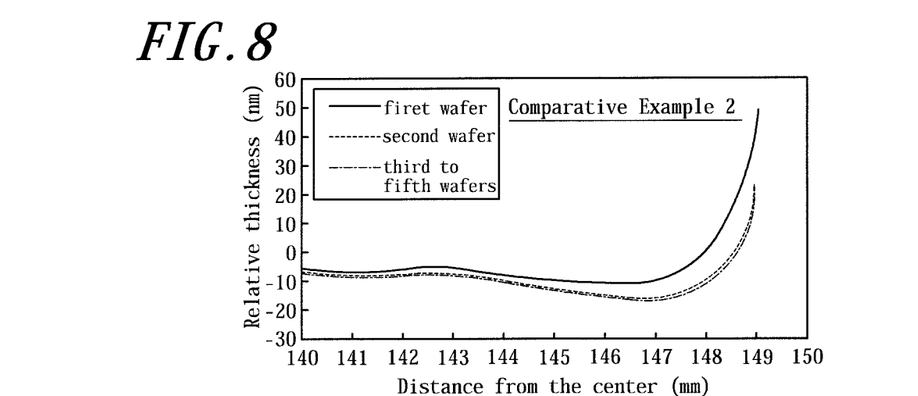
FIG. 8 is a graph of the epitaxial film thickness profiles of epitaxial wafers produced by the process flow shown in FIG. 6 (Comparative Example 2).

FIG. 8 is a graph showing the thickness profiles of epitaxial films. The epitaxial films are produced by the process flow shown in FIG. 6 using an epitaxial wafer production apparatus shown in FIG. 4. The thickness profiles were obtained using the difference between the thickness of a silicon wafer having a diameter of 300 mm before the epitaxial growth process, which was employed in the process flow shown in FIG. 6 and the thickness of the epitaxial wafer produced by the process flow shown in FIG. 6, which were measured using a capacitance type flatness measuring apparatus (product name: WaferSight manufactured by KLA-Tencor Corporation). This graph corresponds to only the periphery 140 mm to 150 mm away from the wafer center, and the horizontal axis of this graph shows the distance from the wafer center toward the radial direction. Further, the vertical axis represents a relative thickness obtained by correcting the film thickness found from the difference between the thickness before and after the epitaxial wafer growth process with reference to a point on a straight line obtained by least squares fitting of the distance of 120 mm to 135 mm from the center and the corresponding film thickness which is normalized to zero (leveled thickness). In the graph, the solid line, the dashed line, and the dot-dashed line correspond to the first, second, and third to fifth epitaxial wafers, respectively. The graphical forms of the third to fifth wafers are almost the same, so that they are shown with one line.

FIG. 8 shows that the film thickness profile at the wafer periphery of the first wafer after cleaning is greatly different from that of the second to fifth wafers. For example, the film thickness of the first wafer and the second and subsequent wafers greatly vary at a distance of 148 mm from the center of the horizontal axis (at a position 2 mm from the wafer edge toward the center) in the graph. Therefore, the epitaxial wafers according to this Comparative Example 2 greatly vary in quality. Note that the above difference in the film thickness at a position 2 mm away from the wafer edge toward the center is referred to as ROA2 difference.

Example 2-1

Figure 9:
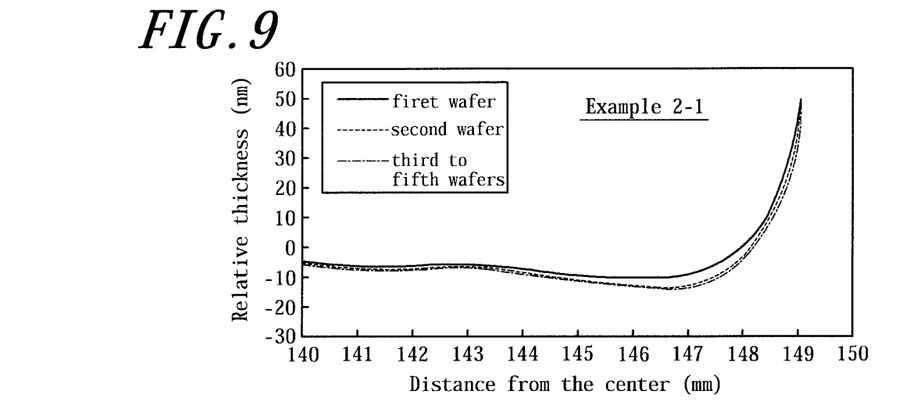
FIG. 9 is a graph of the epitaxial film thickness profiles in a case where five wafers are processed by the process flow in FIG. 3 with the flow rate of reactive gas ($SiHCl_3$ gas) being reduced in second control parameters by a predetermined amount with respect to first control parameters without changing the flow rate of inert gas ($H_2$ gas) in a lower space of a layer formation chamber (Example 2-1).

FIG. 9 is a graph of the epitaxial film thickness profiles in a case where five wafers are processed using an epitaxial wafer production apparatus shown in FIG. 4 by the process flow in FIG. 3, in which the flow rate of reactive gas ($SiHCl_3$ gas) in the second control parameters is reduced with respect to that in the first control parameters by a predetermined amount without changing the flow rate of inert gas ($H_2$ gas) into the lower space 2b of the layer formation chamber 2 (Example 2-1). The measurement method and representations of the vertical axis, horizontal axis, and the like of the graph are the same as FIG. 8.

Here, as comparing FIG. 9 with FIG. 8, as compared with the case where the five wafers are processed by the same process recipe (FIG. 8), in Example 2-1 of FIG. 9, the two process recipes A and B are used in which the flow rates of each reactive gas ($SiHCl_3$ gas) into the upper space 2a of the layer formation chamber 2 are made different, so that the film thickness profiles of the first wafer after cleaning and the second to fifth wafers can be closer to each other.

Example 2-2

Figure 10:
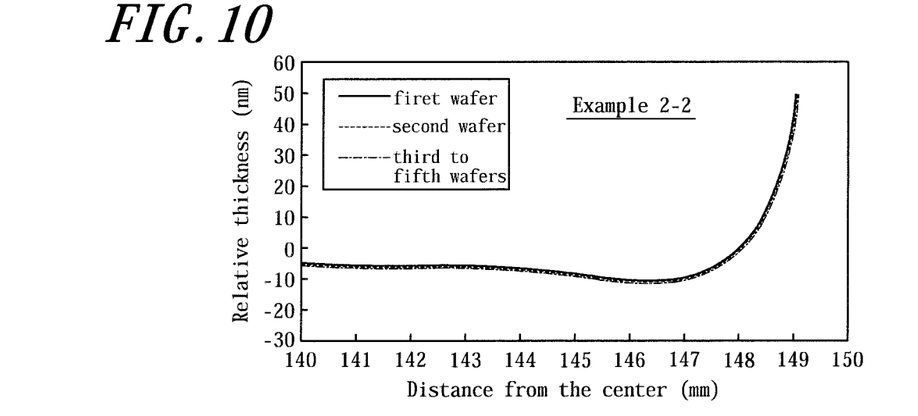
FIG. 10 is a graph of the epitaxial film thickness profiles in a case where five wafers are processed by the process flow in FIG. 3 with both the flow rates of reactive gas ($SiHCl_3$ gas) and inert gas ($H_2$ gas) in a lower space of a layer formation chamber in second control parameters being each reduced by a predetermined amount with respect to first control parameters (Example 2-2).

On the other hand, FIG. 10 is a graph of the epitaxial film thickness profiles in a case where five wafers are processed using an epitaxial wafer production apparatus shown in FIG. 4 by the process flow in FIG. 3, in which both the flow rates of reactive gas ($SiHCl_3$ gas) in the second control parameters and the inert gas ($H_2$ gas) into the lower space 2b of the layer formation chamber 2 are each reduced by a predetermined amount correspondingly (Example 2-2). The measurement method and representations of the vertical axis, horizontal axis, and the like of the graph are the same as FIGS. 8 and 9. The flow rate of the inert gas ($H_2$) into the lower space 2b of the layer formation chamber 2 is reduced by a predetermined amount; thus, the film thickness profiles at the periphery of the first wafer and the second to fifth wafers can be made to coincide with one another as shown in FIG. 10.

Table 1 shows the result of measuring the ROA2 difference between the first processed epitaxial wafer and the second processed epitaxial wafer after a cleaning recipe in five experimental examples including the above Comparative Example 2, Examples 2-1 and 2-2 using the epitaxial wafer production apparatus shown in FIG. 4. The reactive gas flow rate difference in the graph shows the amount of reduction in the second flow rate with respect to the first flow rate of the reactive gas ($SiHCl_3$ gas) charged into the upper space 2a of the layer formation chamber 2. Further, the inert gas flow rate difference shows the amount of reduction in the second flow rate with respect to the first flow rate of the inert gas ($H_2$ gas) charged into the lower space 2b of the layer formation chamber 2. In addition, slm (standard liters per minute) is a unit of flow rate obtained by converting the flow rate at 0° C. at one atmosphere into Liter/Min. The Experimental Examples 3 and 5 in these experimental examples correspond to Embodiment 2 of the present invention.

TABLE 1

| | Reactive gas flow rate difference [slm] | Inert gas flow rate difference [slm] | ROA2 difference [nm] |
|---|---|---|---|
| Experimental Example 1 (Comparative Example 2) | 0 | 0 | 11.7 |
| Experimental Example 2 (Example 2-1) | 2 | 0 | 3.2 |
| Experimental Example 3 (Example 2-2) | 2 | 5 | 0.9 |
| Experimental Example 4 (Example 2-3) | 1.5 | 0 | 4.8 |
| Experimental Example 5 (Example 2-4) | 1.5 | 5 | 1.6 |

In Table 1, the first wafer and the second wafer are processed under the same conditions in Experimental Example 1 (Comparative Example 2). The ROA2 difference indicating the difference in the film thickness of the epitaxial layers was 11.7 nm. Then, as in Experimental Example 2 (Example 2-1), the flow rate of reactive gas in the epitaxial growth of the second wafer is reduced by a predetermined amount (2 slm in Table 1); thus, the ROA2 difference can be reduced to 3.2 nm. Further, as in Experimental Example 3 (Example 2-2), the flow rate of inert gas is reduced by a predetermined amount (5 slm in Table 1); thus, the ROA difference can be reduced to 0.9 nm. Accordingly, the difference in the flow rate of the reactive gas and the difference in the flow rate of inert gas can be determined such that the ROA2 difference approximates to 0. Note that as mentioned earlier, the difference in the flow rate of reactive gas and the difference in the flow rate of inert gas do not depend on the flow rate of reactive gas used in the first epitaxial growth after a cleaning recipe. Consequently, the reactive gas flow rate and inert gas flow rate in the parameters of the process recipe B can be determined based on the parameters of the process recipe A.

Note that the present invention is not limited only to the above embodiments, and many modifications and variations are possible. For example, $SiHCl_3$ gas was used as a silicon reactive gas; however, without being limited to this, another gas such as $SiCl_4$, $SiH_2Cl_2$, or $SiH_4$ can be used alternatively. Further, the gas used for cleaning may be any gas which can remove product of material gas, such as amorphous silicon or a chlorosilane polymer attached and deposited on a wall surface of an epitaxial growth furnace, on a susceptor, etc. In terms of purity and removal efficiency, hydrogen chloride (HCl) is desirably used. Further, diborane ($B_2H_6$) was used as a dopant; however, without being limited to this, phosphine ($PH_3$) or the like can be used alternatively.

Moreover, five wafers were successively produced between one cleaning and another cleaning in the above-described examples; however, the number of wafers produced successively can be arbitrarily set as long as it does not degrade the quality of the epitaxial wafers to be produced. The quality degradation occurs mainly due to silicon deposit precipitated inside the epitaxial growth furnace. Therefore, it is preferable that the number of epitaxial wafers which can be successively produced is previously determined by an experiment and cleaning is performed at least once in processing the predetermined number of wafers.

INDUSTRIAL APPLICABILITY

According to the present invention, epitaxial wafers which do not vary in quality can be produced successively, and productivity of the epitaxial wafers can be improved.

EXPLANATION OF REFERENCE

1: epitaxial growth furnace
2: layer formation chamber
3: upper dome
4: lower dome
5: dome fitting
6: halogen lamps
7: susceptor rotating shaft
8: support arm
9: elevating pins
10: susceptor
10a: outer part
11: lift arms
12: gas supply port
13: gas exhaust port
14: gas supply port
20: epitaxial wafer production apparatus
21: wafer transfer mechanism
22: heating mechanism
23: gas supply-exhaust mechanism
24: storage unit
25: control unit
26: interface unit
W: wafer

The invention claimed is:

1. A method for producing epitaxial wafers using a single wafer processing epitaxial growth furnace, comprising the steps of:
cleaning for removing deposit on a susceptor in the epitaxial growth furnace, wherein the epitaxial growth furnace includes a layer formation chamber which is substantially partitioned into an upper space and a lower space by the susceptor;
after the step of cleaning, performing first wafer processing for obtaining a first epitaxial wafer by mounting a first wafer on the susceptor and growing an epitaxial layer on the first wafer based on first control parameters;
without a step of cleaning for removing deposit on the susceptor in the epitaxial growth furnace after the first wafer processing, performing second wafer processing after transferring the first epitaxial wafer from the susceptor, for obtaining a second epitaxial wafer by mounting a second wafer on the susceptor and growing an epitaxial layer on the second wafer based on second control parameters set such that the second epitaxial wafer has approximately the same film thickness profile as the first epitaxial wafer;
without a step of cleaning for removing deposit on the susceptor in the epitaxial growth furnace after the second wafer processing, performing at least third wafer processing after transferring the second epitaxial wafer from the susceptor, for obtaining a third epitaxial wafer by mounting a third wafer on the susceptor and growing an epitaxial layer on the third wafer based on the second control parameters set such that the third epitaxial wafer has approximately the same film thickness profile as the first and second epitaxial wafers; and
wherein the first control parameters and the second control parameters each include a flow rate of reactive gas supplied to the upper space of the layer formation chamber and a flow rate of inert gas supplied to the lower space of the layer formation chamber, and the flow rate of the inert gas supplied to the lower space in the second control parameters is lower than the flow rate of the inert gas supplied to the lower space in the first control parameters, and
wherein the first and the second control parameters are set such that a difference in epitaxial layer film thickness between the first wafer and the second wafer at a position 2 mm from each respective wafer's edge toward a center of the wafer (ROA2 difference) is 5 nm or less over the peripheries of the first and second wafers.

2. The method for producing epitaxial wafers according to claim 1, wherein a process sequence of performing the step of cleaning, subsequently performing the step of the first wafer processing, and successively performing the steps of the second wafer processing and the at least third wafer processing after the first wafer processing, is carried out repeatedly.

3. The method for producing epitaxial wafers according to claim 1, wherein the first control parameters and the second control parameters are different from each other in at least one of process conditions of the flow rate of reactive gas for growing the epitaxial layer, processing time, and a flow rate of dopant gas.

4. The method for producing epitaxial wafers according to claim 1, wherein the flow rate of the reactive gas, which is included in the second control parameters, is lower than the flow rate of the reactive gas, which is included in the first control parameters.

5. The method for producing epitaxial wafers according to claim 4, wherein a decrease in the flow rate of the inert gas supplied to the lower space in the second control parameters relative to the flow rate of the inert gas supplied to the lower space in the first control parameters is greater than a decrease in the flow rate of the reactive gas supplied to the upper space in the second control parameters relative to the flow rate of the reactive gas supplied to the upper space in the first control parameters.

6. The method for producing epitaxial wafers according to anyone of claims 1 to 3 and 4, wherein at least a surface portion of the susceptor made of silicon carbide (SiC) is exposed by the cleaning step.

7. The method for producing epitaxial wafers according to anyone of claims 1 to 3 and 4, wherein the reactive gas is trichlorosilane ($SiHCl_3$).

8. The method for producing epitaxial wafers according to anyone of claims 1 to 3 and 4, wherein the inert gas is hydrogen gas ($H_2$ gas).

9. The method for producing epitaxial wafers according to claim 1, wherein the epitaxial layer is grown on the second wafer based on second control parameters set such that the second epitaxial wafer has approximately the same film thickness profile at the wafer periphery as the first epitaxial wafer.

10. The method for producing epitaxial wafers according to claim 1, wherein the second control parameters are set such that that a difference between the thickness of the epitaxial layer at the wafer periphery of the second epitaxial wafer and the thickness of the epitaxial layer at the wafer periphery of the first epitaxial wafer is reduced.

11. The method for producing epitaxial wafers according to claim 1, wherein in the first and second control parameters, a gas pressure of the inert gas supplied to the lower space is greater than a gas pressure of the gas supplied to the upper space.

\* \* \* \* \*